(12) United States Patent
Ranish et al.

(10) Patent No.: US 7,867,868 B2
(45) Date of Patent: Jan. 11, 2011

(54) ABSORBER LAYER CANDIDATES AND TECHNIQUES FOR APPLICATION

(75) Inventors: Joseph M. Ranish, San Jose, CA (US); Bruce E. Adams, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 702 days.

(21) Appl. No.: 11/681,343

(22) Filed: Mar. 2, 2007

(65) Prior Publication Data
US 2008/0214014 A1 Sep. 4, 2008

(51) Int. Cl.
*H01L 21/336* (2006.01)

(52) U.S. Cl. .................. 438/308; 438/528; 438/535; 438/676

(58) Field of Classification Search ................. 438/308, 438/528, 535, 676
See application file for complete search history.

(56) References Cited

U.S. PATENT DOCUMENTS

| 2,688,576 | A | * | 9/1954 | Ryan et al. | 428/322.7 |
| 3,421,967 | A | * | 1/1969 | Hochner | 428/211.1 |
| 3,520,656 | A | * | 7/1970 | Yates et al. | 423/345 |
| 4,025,661 | A | * | 5/1977 | Moscony et al. | 427/68 |
| 4,664,768 | A | * | 5/1987 | Scala et al. | 442/244 |
| 5,308,481 | A | * | 5/1994 | Stalling et al. | 210/198.2 |
| 5,461,123 | A | * | 10/1995 | Song et al. | 526/74 |
| 6,302,960 | B1 | | 10/2001 | Baroudi et al. | |
| 6,627,056 | B2 | | 9/2003 | Wang et al. | |
| 6,658,763 | B2 | | 12/2003 | Morad et al. | |
| 6,841,341 | B2 | | 1/2005 | Fairbairn et al. | |
| 7,109,087 | B2 | | 9/2006 | Autryve et al. | |
| 2003/0113653 | A1 | * | 6/2003 | Zheng et al. | 430/138 |
| 2005/0074986 | A1 | * | 4/2005 | Autryve et al. | 438/795 |
| 2007/0032054 | A1 | | 2/2007 | Ramaswamy et al. | |
| 2009/0026704 | A1 | * | 1/2009 | Kling et al. | 273/292 |
| 2009/0173252 | A1 | * | 7/2009 | Nakata et al. | 106/31.6 |

OTHER PUBLICATIONS

First Office Action dated Sep. 18, 2009 for Chinese Application No. 200810006378.7.

* cited by examiner

*Primary Examiner*—Thanh V Pham
(74) *Attorney, Agent, or Firm*—Patterson & Sheridan, LLP (57) ABSTRACT

The present invention generally provides an absorber layer using carbon based materials with increased and stabled thermal absorption coefficient and economical methods to produce such an absorber layer. One embodiment of the present invention provides a method for processing a substrate comprising depositing an absorber layer on a top surface of the substrate, wherein the substrate is maintained under a first temperature, annealing the substrate in a thermal processing chamber, wherein the substrate is heated to a second temperature, and the second temperature is higher than the first temperature, and removing the absorber layer from the substrate.

19 Claims, 4 Drawing Sheets

(PRIOR ART)

US 7,867,868 B2

ABSORBER LAYER CANDIDATES AND TECHNIQUES FOR APPLICATION

BACKGROUND OF THE INVENTION

1. Field of the Invention

Embodiments of the present invention generally relate to fabrication of integrated circuits. More specifically, embodiments of the present invention relate to processes for depositing a layer on a substrate and then annealing the substrate.

2. Description of the Related Art

Many processes in integrated circuit fabrication require rapid high temperature processing steps for deposition of layers on semiconductor substrates, such as silicon-containing substrates, or annealing of previously deposited layers on semiconductor substrates. For example, after dopant ions, such as boron, phosphorus, or arsenic, are implanted into a semiconductor substrate, the substrate is typically annealed to repair the crystalline structure of the substrate that was disrupted during the doping process and to activate the dopants.

During the annealing steps, it is typically preferred to heat and cool substrates quickly to minimize the amount of time that a substrate is exposed to high temperatures that can cause unwanted diffusion and damage the substrate. The annealing steps may be conducted by Rapid Thermal Processing (RTP), Dynamic Surface Annealing (DSA) or heating in a batch furnace. The RTP process heats the entire thickness of the substrate and can raise substrate temperatures at rates on the order of about 200 to 400° C./second. The DSA method scans the substrate with an electromagnetic radiation and only heats and anneals a top surface of the substrate. A top layer of the substrate may be heated to a temperature between 1100° C. to about 1410° C., and cooled down to near ambient temperature in a time on the order of 1 millisecond. While the heating provided by batch furnaces typically raises substrate temperatures at a rate of about 5-15° C./minute. Accordingly, RTP and DSA are more desirable than batch furnace heating.

Uneven heating across the surface of a substrate is often experienced with RTP, DSA or other conventional substrate heating processes due to the patterns on the substrate. As today's integrated circuits generally include a plurality of devices spaced at varying densities across a surface of a substrate and having different sizes, shapes, and materials, a substrate surface can have very different thermal absorption properties across different areas of the substrate surface. For example, a first region of a substrate having a lower density of devices thereon typically will be heated faster than a second region of the substrate that has a higher density of devices thereon than the first region. Varying reflectivities across different areas of the substrate surface can also make uniform heating of the substrate surface challenging.

An absorber layer is generally used to provide uniform reflectivities and/or thermal absorption coefficient across a patterned substrate surface. A state of the art absorber layer may is amorphous carbon layer deposited by low temperature chemical vapor deposition (CVD). However, problems exist for this amorphous carbon layer. For example, if the amorphous carbon layer is formed at a low temperature, properties of the amorphous carbon layer usually change during the annealing process when the temperature is increased. Additionally, light absorb coefficient of the amorphous layer could be increased for more rapid thermal process.

Therefore, there remains a need for an improved absorber layer and method for forming the improved absorber layer to achieve a uniform heating across a surface of the substrate during an annealing process.

SUMMARY OF THE INVENTION

The present invention generally provides an absorber layer using carbon based materials with increased and stable thermal absorption coefficient and economical methods to produce such absorber layer.

One embodiment of the present invention provides a method for processing a substrate comprising depositing an absorber layer on a top surface of the substrate, wherein the substrate is maintained under a first temperature, annealing the substrate in a thermal processing chamber, wherein the substrate is heated to a second temperature, and the second temperature is higher than the first temperature, and removing the absorber layer from the substrate.

Another embodiment of the present invention provides a method for annealing a substrate comprising depositing, on the substrate, an absorber layer at a low temperature which is lower than an annealing temperature, wherein the absorber layer comprises carbon withstands a high temperature which is higher than the annealing temperature, rapidly heating at least part of the substrate to the annealing temperature, and removing the absorber layer from the substrate.

Yet another embodiment of the present invention provide an absorber layer for processing a substrate comprising a high temperature carbon.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention provides material candidates for an improved absorber layer used in a thermal annealing process and methods for applying the improved absorber layer. Particularly, the absorber layer of the present invention comprises high temperature material is applied on a substrate at a temperature lower than the annealing temperature.

Apparatus of Thermal Annealing

Figure 1:
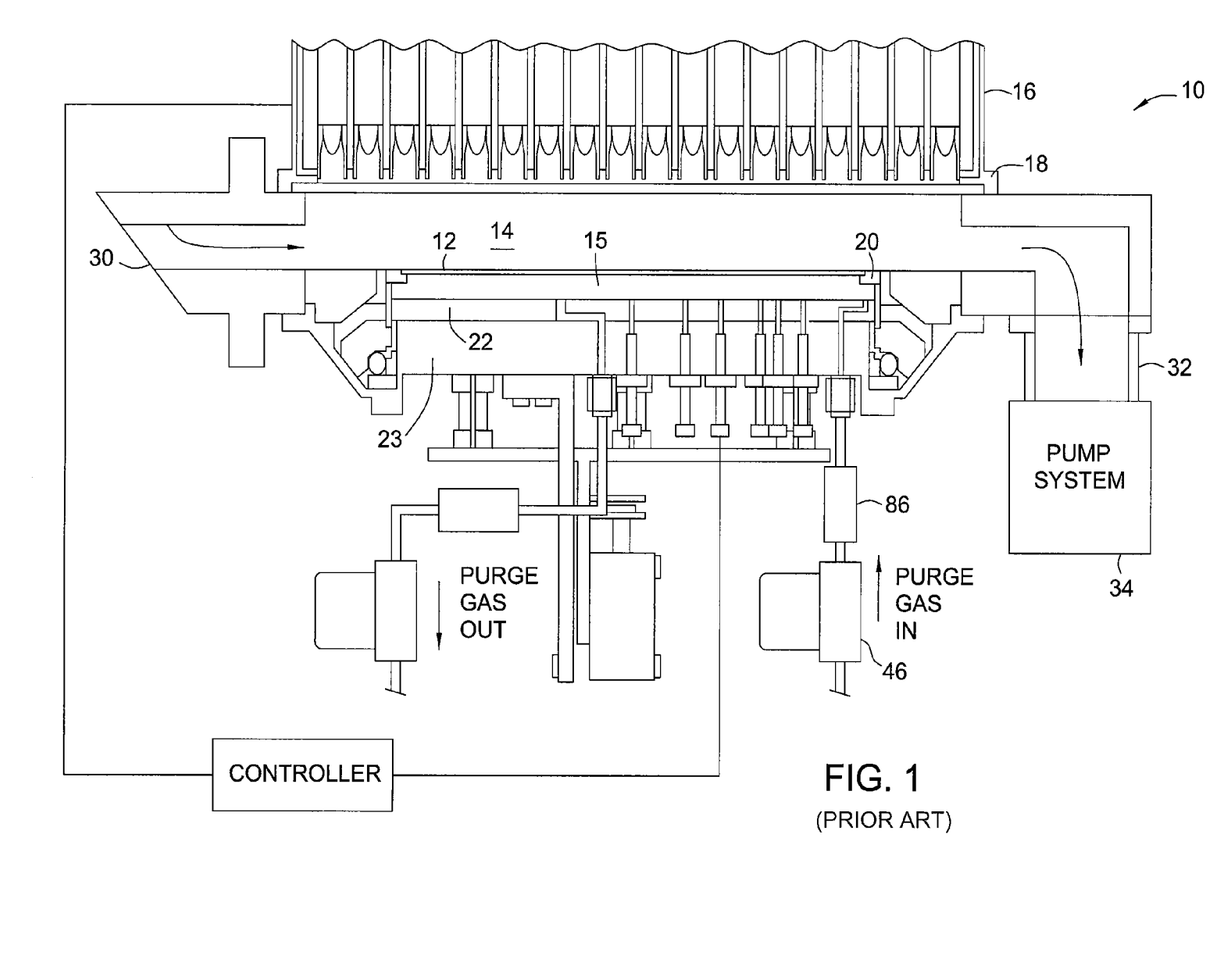
FIG. 1 schematically illustrates an exemplary rapid thermal processing system in accordance with the present invention.

FIG. 1 illustrates an exemplary rapid thermal processing (RTP) system 10 including a processing chamber 14 for annealing a disk-shaped semiconductor substrate 12 in accordance with embodiments described herein. The processing chamber 14 is radiatively heated through a water-cooled quartz window 18 by a heating lamp assembly 16. The peripheral edge of the substrate 12 is supported by a support structure 20, which optionally (not shown) can rotate at a rate of up to about 240 rpm (revolutions per minute). Beneath the substrate 12 is a nickel-plated aluminum reflector plate assembly 22 that has an optically reflective coating facing the backside of the substrate 12 to enhance the effective emissivity of the substrate 12. The reflector plate assembly 22 is mounted on a water-cooled base 23. Cooling down of the substrate 12 may be enhanced by increasing the cooling capacity of the water-cooled base 23 and by locating the reflector plate assembly 22 closer to the water-cooled base 23. Furthermore, the optical coating may be enhanced to absorb radiated energy when the heating lamp assembly 16 is off. Between the top surface of the reflector plate assembly 22 and the backside of the substrate 12 is a reflective cavity 15.

During an annealing processing, gases for the annealing ambient are introduced into the processing chamber 14 through an ambient gas input 30. The ambient gases flow across the top surface of the substrate 12 and may react with the heated substrate 12. Excess ambient gases, as well as any reaction by-products, are withdrawn from the processing chamber 14 through an ambient gas output 32 by a pump system 34. Additionally a purge gas may be introduced into the processing chamber 14 through an input 46 which is connected to a filter 86.

Figure 2:
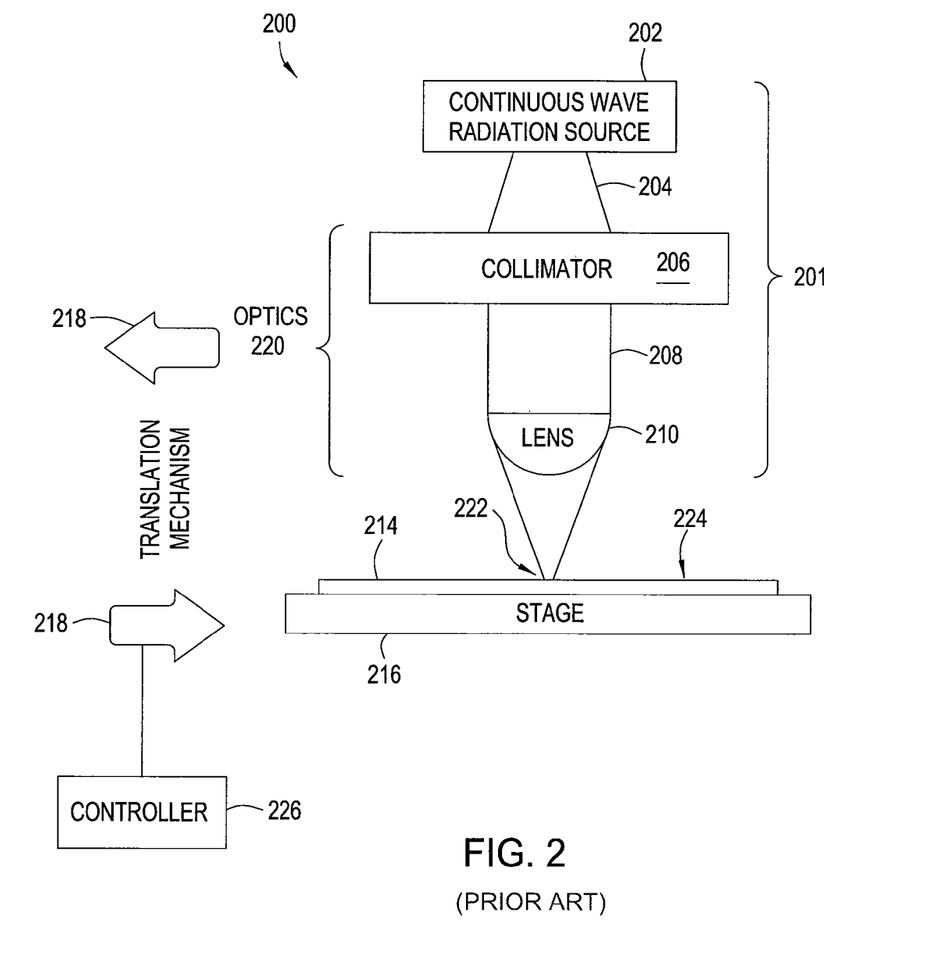
FIG. 2 schematically illustrates an exemplary dynamic surface annealing system in accordance with the present invention.

FIG. 2 schematically illustrates an exemplary laser apparatus 200 for a DSA process described below. The laser apparatus 200 comprises a continuous wave electromagnetic radiation module 201, a stage 216 configured to receive a substrate 214 thereon, and a translation mechanism 218. The continuous wave electromagnetic radiation module 201 comprises a continuous wave electromagnetic radiation source 202 and focusing optics 220 disposed between the continuous wave electromagnetic radiation source 202 and the stage 216.

The focusing optics 220 preferably comprises one or more collimators 206 to collimate radiation 204 from the continuous wave electromagnetic radiation source 202 into a substantially parallel beam 208. This collimated radiation 204 is then focused by at least one lens 210 into a line of radiation 222 at an upper surface 224 of the substrate 214.

Lens 210 is any suitable lens, or series of lenses, capable of focusing radiation into a line. In a preferred embodiment, the lens 210 is a cylindrical lens. Alternatively, the lens 210 may be one or more concave lenses, convex lenses, plane mirrors, concave mirrors, convex mirrors, refractive lenses, diffractive lenses, Fresnel lenses, gradient index lenses, or the like.

The stage 216 is any platform or chuck capable of securely holding the substrate 214 during translation, as explained below. In a preferred embodiment, the stage 216 includes a means for grasping the substrate, such as a frictional, gravitational, mechanical, or electrical system. Examples of suitable means for grasping include mechanical clamps, electrostatic or vacuum chucks, or the like.

The laser apparatus 200 also comprises a translation mechanism 218 configured to translate the stage 216 and the line of radiation 222 relative to one another. The translation mechanism 218 may be coupled to the stage 216 to move the stage 216 relative to the continuous wave electromagnetic radiation source 202 and/or the focusing optics 220. Alternatively, the translation mechanism 218 may be coupled to the continuous wave electromagnetic radiation source 202 and/or the focusing optics 220 to move the continuous wave electromagnetic radiation source 202 and/or the focusing optics 220 relative to the stage 216. The translation mechanism 218 may also move both the continuous wave electromagnetic radiation source 202 and/or the focusing optics 220, and the stage 216. Any suitable translation mechanism may be used, such as a conveyor system, rack and pinion system, or the like.

The translation mechanism 218 is preferably coupled to a controller 226 to control the scan speed at which the stage 216 and the line of radiation 222 move relative to one another. In addition, translation of the stage 216 and the line of radiation 222 relative to one another is preferably along a path perpendicular to the line of radiation 222 and parallel to the upper surface 224 of the substrate 214. In a preferred embodiment, the translation mechanism 218 moves at a constant speed. Preferably, this constant speed is approximately 2 cm/s for a 35 micron wide line. In another embodiment, the translation of the stage 216 and the line of radiation 222 relative to one another is not along a path perpendicular to the line of radiation 222.

Process of Thermal Annealing

Figure 3A:
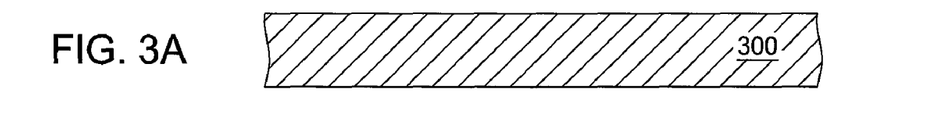
FIGS. 3A-3F schematically illustrate a substrate processing sequence in accordance with one embodiment of the present invention.
Figure 3B:
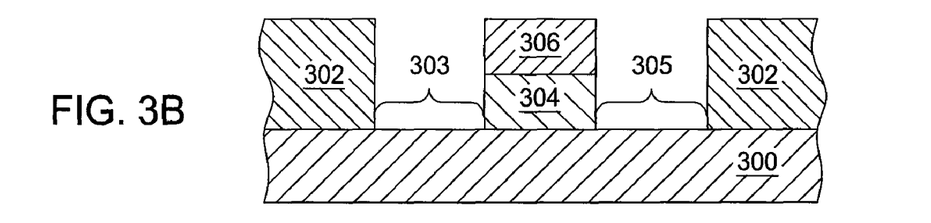
Figure 3C:
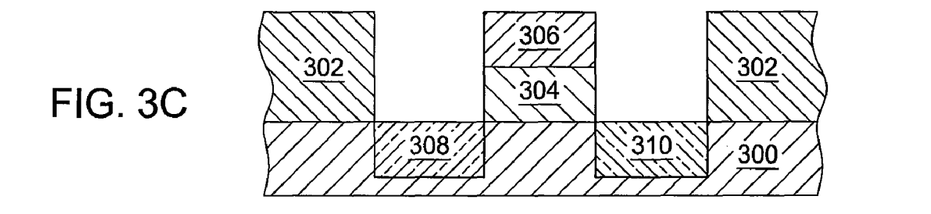

FIGS. 3A-3F schematically illustrate a substrate processing sequence according to an embodiment of the present invention. A substrate 300 comprising silicon is provided, as shown in FIG. 3A. A field oxide layer 302, a gate dielectric 304, and a gate electrode 306 are deposited and patterned on the substrate 300 according to conventional methods to form a gate source area 303 and a drain source area 305 in the substrate 300, as shown in FIG. 3B. Dopant ions are then implanted into the substrate 300 to form a gate source 308 and a gate drain 310, as shown in FIG. 3C.

Figure 3D:
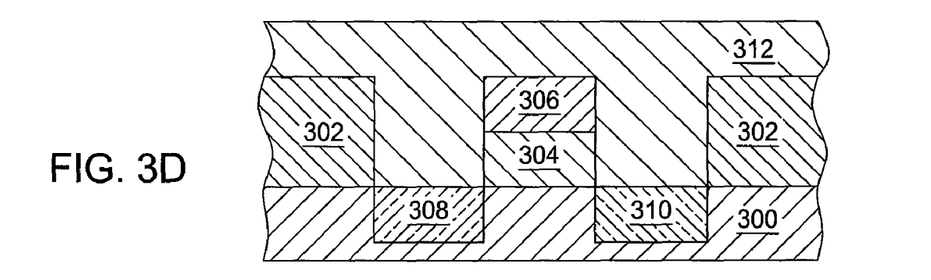

An absorber layer 312 is deposited according to embodiments of the present invention on the substrate 300, as shown in FIG. 3D. The absorber layer 312 is configured to provide a uniform thermal absorption coefficient across the substrate 300 despite the difference among the field oxide layer 302, the gate electrode 306, the gate source 308 and the gate drain 310. In one embodiment, the absorber layer 312 comprises carbon. The carbon in the absorber layer 312 increases the overall light absorption coefficient. In one embodiment, the absorber layer 312 comprises high temperature carbon, such as for example carbon black and graphitized carbon black. Properties of the high temperature carbon in the absorber layer 312 remain stable during the annealing process to be followed. In one embodiment, the substrate 300 is kept within a low temperature, such as under about 450° C., while depositing the absorber layer 312. Various methods, such as spin-on, sooty flame, physical vapor deposition, electrophoretic deposition and electrostatic deposition, may be used to deposit the absorber layer 312. Detailed description of these methods is to follow.

Figure 3E:
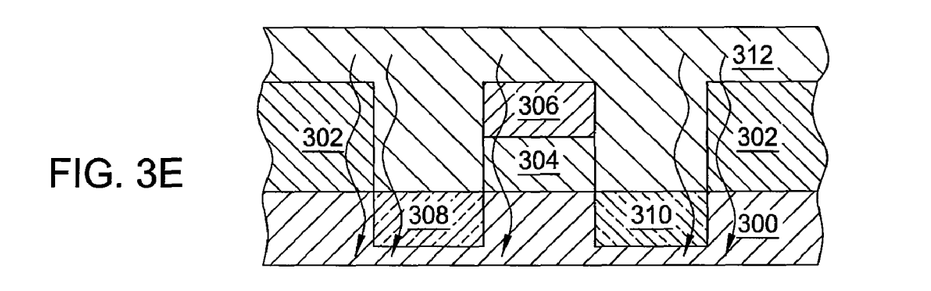

The substrate 300 is then annealed according to an embodiment of the invention, as shown in FIG. 3E. The annealing process may be conducted by DSA or RTP according to the process requirement. Generally, the absorber layer 312 is relatively thin for a DSA process, while the absorber layer 312 is relatively thick for a RTP process.

Figure 3F:
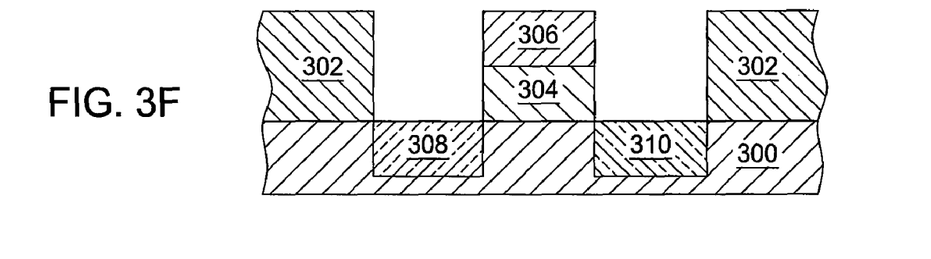

The absorber layer 312 is then removed from the substrate 300, as shown in FIG. 3F. In one embodiment, the absorber layer 312 may be removed by providing an oxidizing agent, such as ozone or oxygen plasma generated in remote plasma source, to the annealing chamber. In one embodiment, the absorber layer 312 may be removed using an oxidizing agent at a low temperature, such as a temperature below about 450° C. Low temperature oxidizing agent may include ozone, and low temperature oxygen plasma. In another embodiment, the absorber layer 312 may be removed using an ultrasonic source. In another embodiment, the absorber layer 312 may be removed using an ultrasonic source followed by a liquid oxidizing agent, such as hydrogen peroxide ($H_2O_2$).

While FIGS. 3A-3F show only one gate device on a substrate, it is recognized that the layers described herein will typically be formed on a substrate that includes a plurality of devices of different sizes, types, and materials and spaced at varying densities across the surface of the substrate. It is believed that the layers promote uniform heating across a surface of the substrate during annealing of the substrate in spite of varying device topography across the surface of a substrate.

Candidate for the Absorber Layer

Generally, an absorber layer, such as the absorber layer 312 in FIG. 3D, is configured to provide an increased and uniform light absorption coefficient across a substrate, particularly a patterned substrate, so that the substrate may be quickly and evenly heated in a thermal processing step, such as annealing. In one embodiment of the present invention, thermal properties of the absorber layer remain stable during the process steps including deposition of the absorber layer and the thermal processing step following the deposition step. In one embodiment, the absorber layer comprises high temperature material, such as carbon black, graphitized carbon black, fullerene, or modified fullerenes. Because the high temperature material, such as carbon black or graphitized carbon black, can stand high temperature, the absorber layer of the present invention remains stable as the substrate being heated and cooled in thermal processes.

Carbon Black Used in the Absorber Layer

Amorphous carbon may be obtained by heating carbonizing precursors, such as petroleum coke, oil, and coal-tar pitch, in an inert environment. Carbon black is a form of amorphous carbon. Carbon black may be collected from a fuel rich flame, such as sooty flame, using a cold substrate. Carbon black is fine in size. There are several advantages of using carbon black in the absorber layer.

First, carbon black has higher light absorption coefficient than the amorphous carbon layer deposited by a low temperature plasma chemical vapor deposition in the state of the art absorber layer.

Second, carbon black may be found in natural form and may be produced at a temperature much higher than the thermal processing temperature, which is lower than about 450° C., in semiconductor processing. Therefore, properties, such as thermal absorption coefficient, stay stable during the thermal process. The thermal absorption coefficient of the state of the art absorber layer, formed from low temperature plasma chemical vapor deposition, increases as the layer is heated during processing. The absorber layer with carbon black thus makes thermal processing easier to control.

Third, the small particle size of carbon black enables the absorber layer to be sufficiently thin using methods without high vacuum. Carbon black generally has a particle size of less than 50 nm. As described below, carbon black may be deposited on a substrate surface by spin-on method to produce a thin film of absorber layer.

Graphitized Carbon Black Used in the Absorber Layer

Graphitized carbon black is another candidate for the absorber layer of the present invention. Graphitized carbon black may be produced by heating certain carbonizing precursor to above 2800° C. in an inert environment for about 2 hours. Graphitized carbon black has graphite structure which may be in discrete layer planes.

Compared with carbon black, graphitized carbon black stands higher temperature which makes it desirable for DSA processing since a substrate may be heated to a temperature between 1100° C. to about 1410° C. during DSA.

Milled Graphite Used in the Absorber Layer

Finely milled graphite may be another candidate for the absorber layer. Graphite is layers of carbon atoms bonded into hexagonal structures. Different layers of carbon atoms are connected together by van der Waals forces. Finely milled graphite layer may have particle size of about a tenth of a micron. Finely milled graphite may be suspended in a suspension agent and applied on a substrate to form an absorber layer. AQUADAG®, which is a commercially available finely milled graphite suspended in water, may be used directly to form an absorber layer.

Fullerene Used in the Absorber Layer

In one embodiment of the present invention, the absorber layer comprises fullerene or modified fullerenes. Fullerene is an exotic crystal structure of carbon. Fullerene has a typical structure contains 60 carbon atoms in a spherical structure consisting of 20 hexagons and 13 pentagons arranged on the surface. Variation of fullerenes may be dissolved or suspended and applied to a substrate to form an absorber layer with high thermal absorption coefficient and stable thermal properties.

Additionally, the absorber layer of the present invention may comprise one of carbon black, graphite carbon black, fullerene, modified fullerene and the combination thereof.

Methods for Applying the Absorber Layer

The absorber layer in accordance with embodiments of the present invention may be applied to a substrate by various methods.

Spin-On Application

In one embodiment of the present invention, the absorber layer of the present invention may be applied on the substrate through a spin-on method, similar to application of photoresist on a semiconductor substrate. The spin-on application may be performed in atmosphere pressure. Compared with the CVD application of the absorber layer, the spin-on application is much cheaper and faster, therefore, increasing the cost of ownership.

In one embodiment of the present invention, materials for the absorber layer, such as carbon black, graphitized carbon black, fullerene, or modified fullerene, is first suspended in a suspension agent to form a suspension. The suspension agent may be any compatible agent that may be removable at a low temperature, such as a temperature between about 100° C. and about 150° C. In one embodiment, the suspension agent is alcohol based, for example a polyvinyl alcohol. The suspension is then dropped on a spinning substrate to form a layer of the suspension. The absorber layer may be formed upon the removal of the suspension agent.

In another embodiment, a colloidal solution of materials for the absorber layer, such as carbon black, graphitized carbon black, fullerene, or modified fullerene, may be formed and dispensed on a spinning substrate to form a coat of the colloidal solution. The absorber layer may be formed by curing the colloidal solution at a temperature lower than the annealing temperature.

Figure 4:
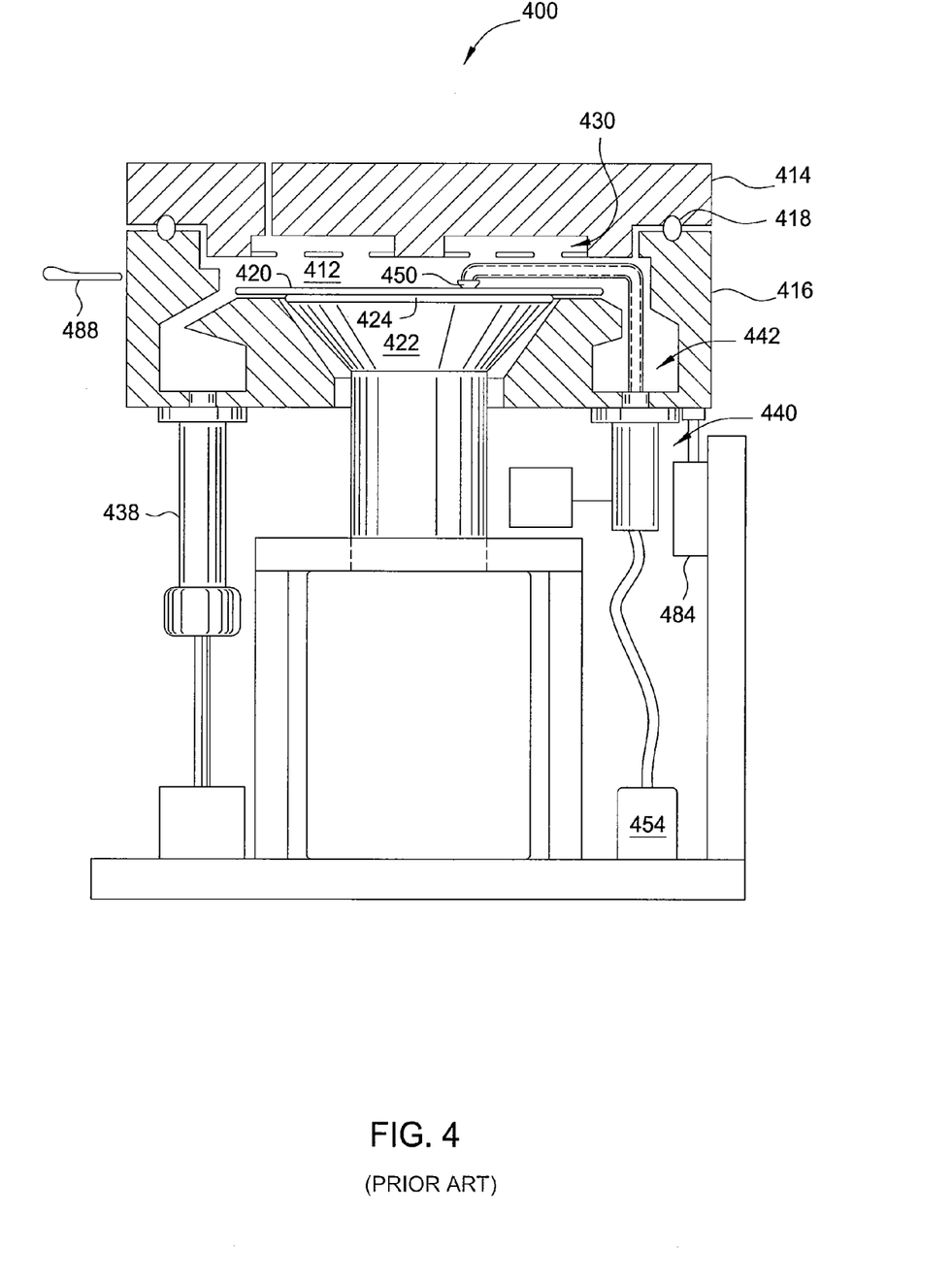
FIG. 4 schematically illustrates an exemplary coater suitable for application of the absorber layer of the present invention.

FIG. 4 schematically illustrates a coater 400 suitable for the spin-on application of the absorber layer. The coater 400 may be also used in application of photoresist on a substrate. The coater 400 includes a controllable pressurized process chamber 412 formed by a housing having an upper section 414 and a lower section 416. The upper section 414 is sealed to the lower section 416, e.g., by an O-ring 418. The sealed process chamber 412 provides a controlled environment for improved process uniformity.

A substrate 420 is supported in the process chamber 412 on a chucking surface 424 of a chuck 422. The chuck 422 is coupled to a rotary motor to rotate the substrate 420. The substrate 420 may be rotated up to 10,000 rpm during the spin-on coating step. The rpm setting will depend upon a variety of process parameters, such as the pressure in the process chamber 412 and the type of coating to be applied.

The vertical position of the lower section 416 may be controlled by one or more air cylinders 484. To insert or remove the substrate 420 from the process chamber 412, the air cylinder 484 lowers the lower section 416 to permit access by a robot arm 488.

A shower-head assembly 430 is formed in the upper section 414 for introducing a solvent vapor into the process chamber 412. The solvent vapor introduced by the shower head assembly 430 into process chamber 412 may be evacuated by an exhaust system 438. By controlling the solvent vapor pressure with the vapor delivery system and the exhaust system, the rate of evaporation of solvent in the coating may be controlled, thereby controlling the rate of curing.

A uniform layer of coating, such as a suspension or colloidal solution of the absorber layer material, is sprayed onto the substrate 420 by a dispensing system 440. The dispensing system 440 includes a pivotable dispensing arm 442. A dispensing head 450 is located at the end of the dispensing arm 442. The dispensing head 450 is equipped with a nozzle. A coating source 454 may be connected to a pump that provides coating at a controllable flow rate and pressure.

Sooty Flame Application

In one embodiment of the present invention, an absorber layer comprising carbon black may be deposited using a sooty flame. In one embodiment of the present invention, the absorber layer may be deposited by striking a sooty flame with acetylene ($C_2H_2$) rich air through a ribbon burner and scanning through a substrate.

Carbon PVD Application

In one embodiment of the present invention, an absorber layer may be formed by a physical vapor deposition (PVD) process. In one embodiment, the physical vapor deposition process comprises striking a carbon arc in a low pressure PVD system to evaporating carbon, and condensing carbon vapor on a substrate to be processed. The condensed carbon vapor forms an absorber layer. The absorber layer formed by PVD generally comprises amorphous carbon.

Electrophoretic Deposition Application

In one embodiment of the present invention, an absorber layer may be formed using electrophoretic deposition. During an electrophoretic deposition, candidate for the absorber layer, such as carbon black, graphitized carbon black, or fullerene, is suspended in a liquid medium. An electric field (electrophoresis) is applied to the liquid medium. The candidate for absorber layer may be deposited on a conductive surface of a substrate when the conductive surface is in contact with the liquid medium.

Electrostatic Deposition Application

In one embodiment of the present invention, an absorber layer may be formed using electrostatic deposition. In one embodiment of the invention, the absorber layer may be deposited by powder coating. During powder coating, powder of carbon black or graphitized carbon is sprayed through an electrostatic gun towards an electrically grounded substrate surface.

In one embodiment, electrostatic force may be maintained on an absorber layer during an anneal process. The electrostatic force may prevent particles in the absorber layer from "flaking out" while rapid heating and cooling causing rapid reface extension gradient in the direction perpendicular to the substrate surface. In one embodiment, electrostatic force may be applied to the absorber layer by positioning a substrate on an electrostatic chuck and keeping the substrate chucked during thermal annealing process. The electrostatic force may be particularly benefit to in DSA in which the temperature gradient is relatively large in vertical direction.

It should be noted that the absorber layer of the present invention is applicable whenever attempting to uniformly heat a patterned substrate through radiation. The absorber layer is also applicable when radiantly heat a transparent substrate or a substrate with a low absorption coefficient.

While the foregoing is directed to embodiments of the present invention, other and further embodiments of the invention may be devised without departing from the basic scope thereof, and the scope thereof is determined by the claims that follow.

The invention claimed is:

1. A method for processing a substrate, comprising:
    depositing an absorber layer on a top surface of the substrate, wherein the substrate is maintained under a first temperature, and the absorber layer comprises carbon black, graphite carbon black, finely milled graphite, fullerene, modified fullerene, or combinations thereof;
    annealing the substrate in a thermal processing chamber, wherein the substrate is heated to a second temperature, and the second temperature is higher than the first temperature; and
    removing the absorber layer from the substrate.

2. The method of claim 1, wherein depositing the absorber layer comprises:
    suspending one of carbon black, graphite carbon black, finely milled graphite, fullerene, modified fullerene, or combinations thereof in a suspension agent to form a suspension; and
    dispensing the suspension on the top surface of the substrate while spinning the substrate to form a coat of the suspension across the substrate; and
    removing the suspension agent from the coat of the suspension.

3. The method of claim 1, wherein depositing the absorber layer comprises electrophoretically depositing one of carbon black, graphite carbon black, fullerene, modified fullerene and the combination thereof on the top surface of the substrate.

4. The method of claim 1, wherein depositing the absorber layer comprises electrostatically depositing one of carbon black, graphite carbon black, fullerene, modified fullerene and the combination thereof on the top surface of the substrate.

5. The method of claim 1, wherein depositing the absorber layer comprises depositing carbon black on the substrate by striking a sooty flame across the top surface of the substrate.

6. The method of claim 1, wherein annealing the substrate comprises annealing the substrate using a rapid thermal process.

7. The method of claim 1, wherein annealing the substrate comprises annealing the substrate using dynamic surface annealing.

8. The method of claim 1, wherein removing the absorber layer comprises providing an oxidation agent to the thermal processing chamber.

9. The method of claim 8, wherein the oxidation agent comprises one of ozone, or oxygen plasma from a remote plasma source.

10. The method of claim 1, wherein removing the absorber layer comprises cleaning the substrate using an ultrasonic source.

11. The method of claim 10, wherein removing the absorber layer further comprise applying a liquid oxidation agent to the substrate.

12. A method for annealing a substrate, comprising:
depositing, on the substrate, an absorber layer at a low temperature which is lower than an annealing temperature, wherein the absorber layer comprises carbon withstands a high temperature which is higher than the annealing temperature, and the high temperature carbon comprises carbon black, graphite carbon black, finely milled graphite, fullerene, modified fullerene, or combinations thereof;
rapidly heating at least part of the substrate to the annealing temperature; and
removing the absorber layer from the substrate.

13. The method of claim 12, wherein depositing the absorber layer comprises depositing carbon black using sooty flame.

14. The method of claim 12, wherein the absorber layer comprises graphitized carbon black produced by heating carbonizing precursor to above 2800° C. in an inert environment for about 2 hours.

15. The method of claim 12, wherein depositing the absorber layer comprises:
suspending the high temperature carbon in a liquid medium;
forming a coat on the substrate with the liquid medium having the high temperature carbon suspended therein; and
removing the liquid medium from the coat on the substrate.

16. The method of claim 12, wherein depositing the absorber layer comprises electrophoretically depositing a layer of the high temperature carbon on the substrate.

17. The method of claim 12, wherein depositing the absorber layer comprises electrostatically depositing a layer of the high temperature carbon on the substrate.

18. The method of claim 12, further comprising applying an electrostatic force to the substrate while rapidly heating at least part of the substrate to the annealing temperature.

19. The method of claim 1, wherein annealing the substrate comprises heating the substrate by a rapid thermal process, a dynamic surface annealing process, or a combination of the rapid thermal process and the dynamic surface annealing process.

* * * * *

UNITED STATES PATENT AND TRADEMARK OFFICE
CERTIFICATE OF CORRECTION

| | | |
|---|---|---|
| PATENT NO. | : 7,867,868 B2 | Page 1 of 1 |
| APPLICATION NO. | : 11/681343 | |
| DATED | : January 11, 2011 | |
| INVENTOR(S) | : Ranish et al. | |

It is certified that error appears in the above-identified patent and that said Letters Patent is hereby corrected as shown below:

On the Title Page In the References Cited (56):

Please delete "2009/0026704 A1* 1/2009 Kling et al." and insert -- 2009/0226704 A1* 9/2009 Kauppinen et al. -- therefor.

Signed and Sealed this
Tenth Day of May, 2011

David J. Kappos
*Director of the United States Patent and Trademark Office*